US007538546B2

(12) United States Patent
Patland et al.

(10) Patent No.: US 7,538,546 B2
(45) Date of Patent: May 26, 2009

(54) IN-PLANE MAGNETIC FIELD GENERATION AND TESTING OF MAGNETIC SENSOR

(75) Inventors: Henry Patland, Los Gatos, CA (US); Wade A. Ogle, San Jose, CA (US)

(73) Assignee: Infinitum Solutions, Inc., Santa Clara, CA (US)

( * ) Notice: Subject to any disclaimer, the term of this patent is extended or adjusted under 35 U.S.C. 154(b) by 232 days.

(21) Appl. No.: 11/558,779

(22) Filed: Nov. 10, 2006

(65) Prior Publication Data

US 2008/0111544 A1 May 15, 2008

(51) Int. Cl.
*G01R 33/12* (2006.01)

(52) U.S. Cl. ...................................... 324/210; 324/262

(58) Field of Classification Search ................. 324/202, 324/210, 212, 228, 234, 239, 260, 261, 262, 324/263, 537, 754, 755, 207.21, 207.24
See application file for complete search history.

(56) References Cited

U.S. PATENT DOCUMENTS 3,344,850 A * 10/1967 De Forest ................... 165/256
4,581,118 A 4/1986 Class et al.
5,589,039 A 12/1996 Hsu
5,717,371 A 2/1998 Crow
6,099,706 A 8/2000 Hirabayashi et al.
6,492,808 B1 * 12/2002 Sukhorukov et al. ........ 324/242
6,545,580 B2 4/2003 Hegde et al.
6,844,724 B1 1/2005 Peng et al.
6,937,127 B2 8/2005 Oster
7,005,876 B2 2/2006 Wei et al.
2005/0134257 A1 * 6/2005 Etherington et al. ..... 324/207.2
2008/0106259 A1 * 5/2008 Stuve .................... 324/207.24

FOREIGN PATENT DOCUMENTS

JP 10-142275 5/1998

* cited by examiner

*Primary Examiner*—Kenneth J Whittington
(74) *Attorney, Agent, or Firm*—Silicon Valley Patent Group LLP

(57) ABSTRACT

A set of magnets, e.g., electromagnets, are used to produce an in-plane magnetic field with respect to an article under test or manufacture. The set of electromagnets includes electromagnets that are positioned above and below the plane of symmetry respectively. The bottom electromagnets may be positioned below the surface of the chuck for example. The plane of the article and/or set of electromagnets are positioned so that the plane of symmetry approximately coincides with the article. The set of electromagnets may include individual electromagnets or C-core electromagnets, which may produce magnetic fields with complementary polarities near the field of symmetry both above and below the field of symmetry. Magnetic fields with the same polarity are positioned near each other on opposite sides of the plane of symmetry to produce the in-plane magnetic field. A second set of electromagnets may be used to provide field rotation if desired.

42 Claims, 8 Drawing Sheets

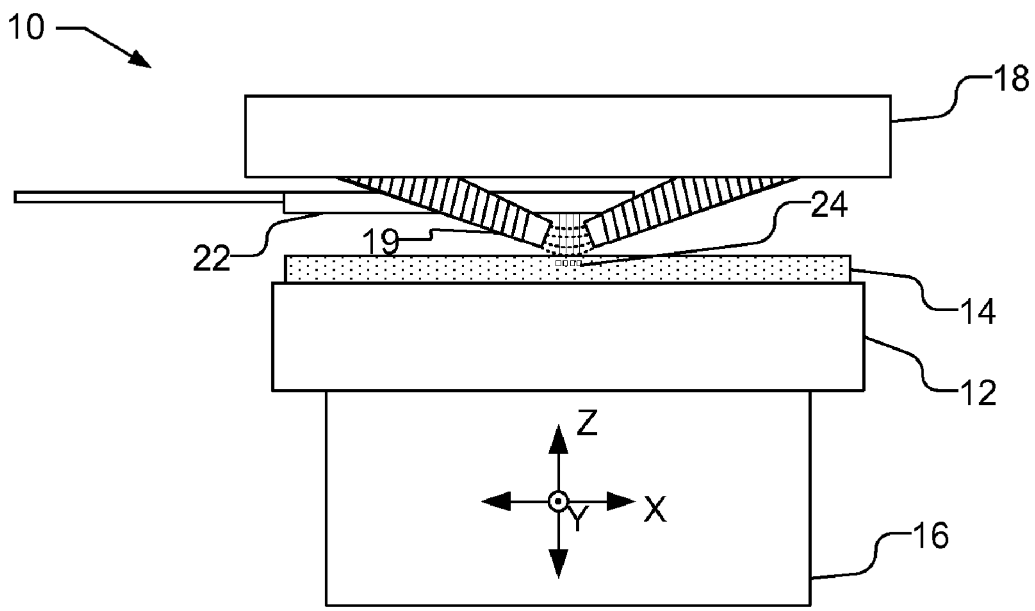
Fig. 1
(Conventional)
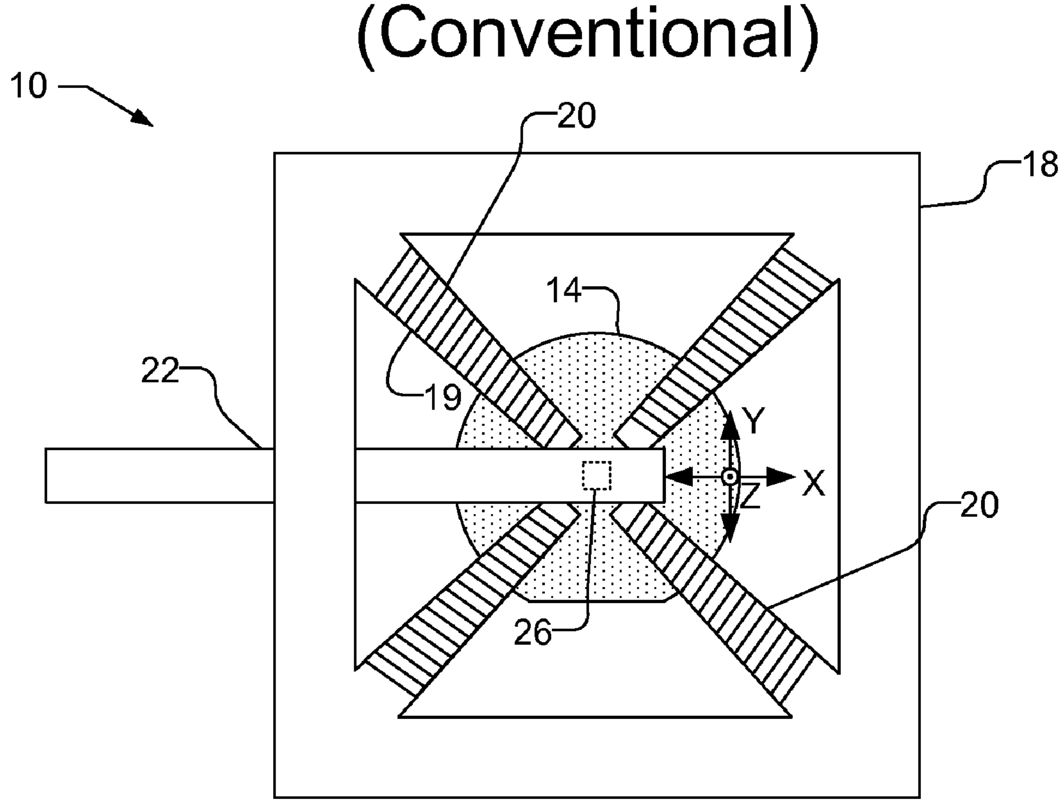
Fig. 2
(Conventional)

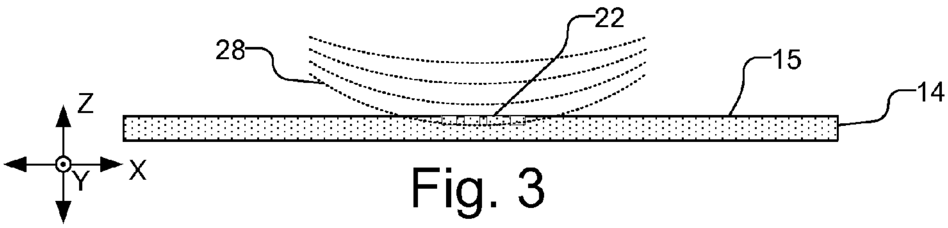
Fig. 3
(Conventional)

Along X

Along Z

IN-PLANE MAGNETIC FIELD GENERATION AND TESTING OF MAGNETIC SENSOR

FIELD OF THE INVENTION

The present invention is related to the production of a magnetic field, and, in particular, to producing a magnetic field that is parallel with the plane of a subject article.

BACKGROUND

Magnetic fields are often used in the production or testing of articles. For example, magnetic and magneto-optic heads, which are used to read and write data on disk drives, are generally tested while placed in a magnetic field. It is important to test such heads to ensure that a defective head is not installed within a disk drive. Moreover, to reduce costs and/or to increase throughput, it is desirable to test for defective heads early in the production cycle.

One type of tester used to ensure device performance and reliability early in the production cycle tests the magneto-resistive characteristics of heads while they are in wafer form, which includes thousands of magneto-resistive (MR) heads. Typically only a subset of the MR heads in a wafer is tested. Testing MR heads in wafer form requires a probe to contact one or more of the MR heads while a magnetic field is generated perpendicular to the particular MR head or heads under test. Moreover, in wafer form, the MR heads are vertical and therefore the required magnetic field must be applied parallel to the surface of the wafer. For optimal test results the precise amount of field applied to the MR heads under test should be known and should be repeatable under ongoing test operations. Conventional testers use fringe magnetic fields, which unfortunately produce a magnetic field that is only approximately parallel to the surface of the wafer in a very small area. Accordingly, the number of MR heads that can be tested simultaneously with such a tester is very limited.

Thus, it is desirable to improve the production of magnetic fields to produce fields that are plane with the surface of a wafer or other item under test.

SUMMARY

In accordance with an embodiment of the present invention, a set of magnets are used to produce an in-plane magnetic field with respect to an article under test or manufacture. The set of magnets, which may be permanent or electromagnets, may include individual magnets or C-core type magnets to produce magnetic fields with complementary polarities near the field of symmetry both above and below the field of symmetry. In one embodiment, first and second electromagnets are positioned above the plane of symmetry and third and fourth electromagnets that are positioned below the plane of symmetry. During operation the plane of the article and/or set of electromagnets are positioned so that the plane of symmetry approximately coincides with the article. The first and second electromagnets have complementary magnetic pole orientations as do the third and fourth electromagnets. Moreover, the first and third electromagnets are positioned to place the same magnetic poles opposite each other with respect to the plane of symmetry as are the second and fourth electromagnets. The chuck that holds the article may include a concave bottom surface in which the third and forth electromagnets are at least partially positioned.

BRIEF DESCRIPTION OF THE DRAWINGS

FIGS. 1 and 2 illustrate a side view and top view, respectively, of a conventional tester using a fringe magnetic field to approximate an in-plane magnetic field.

FIG. 3 illustrates a close up side view of the fringe magnetic field of FIG. 1.

DETAILED DESCRIPTION

Figure 4A:
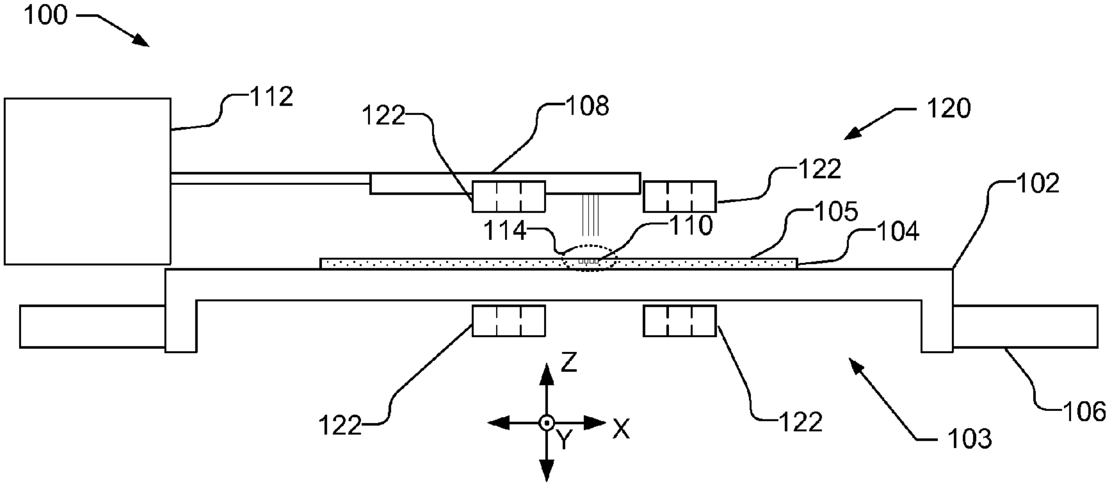
FIGS. 4A and 4B are side views of wafer level magnetoresistive (MR) element testers that use an arrangement of electromagnets to produce an in-plane magnetic field, in accordance with embodiments of the present invention.

In accordance with an embodiment of the present invention, a plurality of electromagnets is arranged above and below the plane of an article in order to generate an in-plane magnetic field, i.e., a magnetic field that is parallel with a surface of the article. The in-plane magnetic field may be used during the testing of article, e.g., during the testing of magnetoresistive elements, such as magnetoresistive or magneto-optical heads or magnetoresistive random access memory (MRAM) or other such devices, or alternatively during the manufacturing of the article, such as where an in-plane magnetic field is desired during the deposition of a film on the article.

By way of comparison, conventional systems use magnetic field fringe effects to approximate an in-plane magnetic field. FIGS. 1 and 2, for example, illustrate a side view and top view, respectively, of a conventional tester 10 that uses fringe effects to approximate an in-plane magnetic field. Tester 10 includes a chuck 12 on which a wafer 14 is held. The chuck 12 may be moved in the x, y, and z directions, as indicated, by a servo system 16. The chuck 12 and servo system 16 are hidden from view in FIG. 2. Above the chuck 12 (and wafer 14) is an electromagnet 18, illustrated in FIG. 2 as a square with elements or arms 19 extending inward from the corners and downward, out of the plane of the square, towards the wafer 14, as illustrated in FIG. 1. A series of windings 20, through which current is passed to produce a magnetic field, are arranged around the arms 19. The tester 10 also includes a probe card 22 that engages the contact pads 24 of a head (within the wafer) under test, which is illustrated by broken lines 26 in FIG. 2.

The electromagnet 18 produces a magnetic field between the arms 19. The wafer 14 is positioned so that it is in the fringe of the magnetic field. FIG. 3 illustrates a close up side view of the wafer 14 with contact pads 24 and an exaggerated view of the magnetic field lines 28 that are produced by electromagnet 18 (not shown in FIG. 3). As can be seen in FIG. 3, the electromagnetic field lines 28 are approximately parallel to the surface 15 of the wafer 14 at the location of the contacts 22. However, the electromagnetic field lines 28 are curved, and thus are not truly parallel to the surface 15 of the wafer 14. Consequently, the magnitude of the magnetic field in which the head is tested may vary by large amounts with small changes in the x, y, and z position of the wafer 14.

FIG. 4A is a side view of a tester 100 that uses an arrangement of electromagnets 120 to produce an in-plane magnetic field during the test of an article, such as a magnetoresistive devices, e.g., MR heads or MRAM, which may be in wafer form. The tester 100 includes a chuck 102 for holding a wafer 104 with an MR head that is under test and a positioning system 106 that moves the chuck 102 (and wafer 104) in the x, y, and z directions to position other MR heads for test. A probe card 108 is positioned to contact the contact pads 110 of a head in the wafer. As illustrated in FIG. 4A, the probe card 108 is connected to a processor 112 that controls the test of the head, including receiving and processing the data from the head and reporting the result of the test of the head. The tester 100 may be used to perform any desired test where an in-plane magnetic field is desired. By way of example, the tests described in U.S. Pat. No. 6,943,545, by Patland et al, entitled "Magnetic Head Tester", which is incorporated herein by reference, may be performed on an MR head in wafer form using tester 100. The reporting of the results of the test of the head may include, e.g., displaying the result, providing a printed result and/or simply storing the result in a computer readable medium. The processor 112 may also control the electromagnets 120 to produce the desired value and orientation of the magnetic field. As can be seen in FIG. 4A, the arrangement of electromagnets 120 includes electromagnets 122 on both sides, i.e., the top and bottom, of the wafer 104. The electromagnets 122 are arranged so that the magnetic field generated is parallel to the surface 105 of the wafer 104 in the test region, indicated by dotted lines 114. It should be understood that the positioning system 106 provides relative motion between the chuck 102 (and wafer 104) with respect to the electromagnets 120 and probe card 108. Thus, for example, chuck 102 may move with respect to the electromagnets 120 and probe card 108, the electromagnets 120 and probe card 108 may be moved with respect to the chuck 102, or if desired, both chuck 102 and the arrangement of the electromagnets 120 and probe card 108 may move.

Figure 5A:
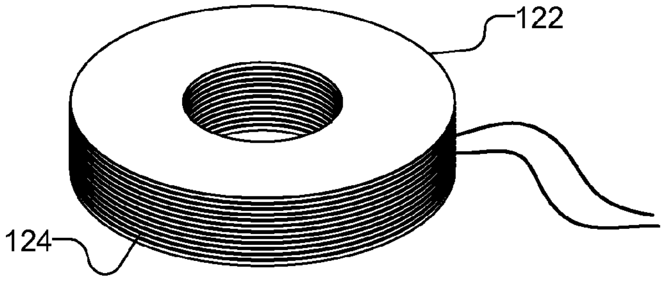
FIGS. 5A and 5B illustrate perspective views of an air core electromagnet and a solid core electromagnet, respectively.
Figure 5B:
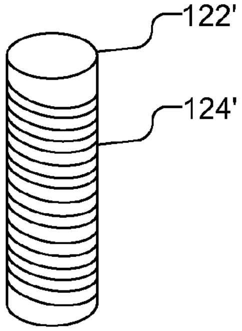

The electromagnets 122 are, by way of example, air core electromagnets, illustrated in perspective view in FIG. 5A. The air core electromagnets 122 include a series of windings 124 through which a current is transmitted to produce a magnetic field of a desired orientation and magnitude. The use of air core electromagnets is particularly advantageous because of the speed at which these electromagnets may change the magnetic field compared to the solid core magnets used in conventional systems, such as that illustrated in FIGS. 1 and 2. Of course, if desired, a solid core electromagnet 122' with windings 124', as illustrated in perspective view in FIG. 5B, may be used with the present invention. It should be understood that solid core as used herein includes a laminated core.

Figure 4B:
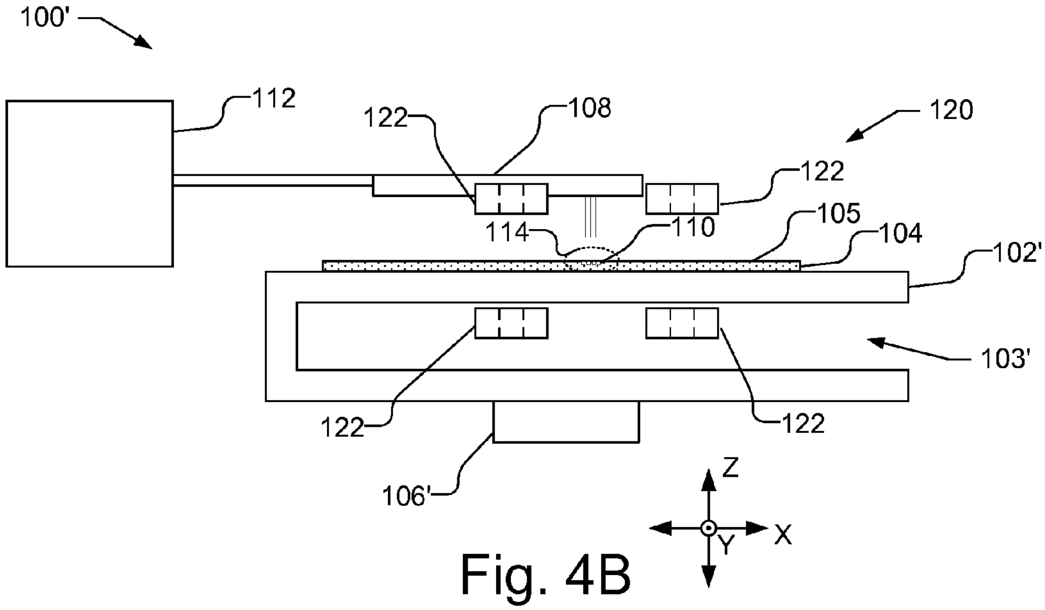

As illustrated in FIG. 4A, the chuck 102 and positioning system 106 are configured so that they do not interfere with the electromagnets 122 that are located under the chuck 102 and wafer 104. The chuck 102 may include a concave bottom portion 103 in which the bottom electromagnets may be, at least partially, inserted. Moreover, the chuck 102 should be dimensioned so that the when the bottom electromagnets 122 do not contact or otherwise interfere with the chuck 102 when the extreme edges of the wafer 104 are positioned in the testing region 114. Moreover, because of the presence of electromagnets 122 under the chuck 102, the positioning system 106 is attached to at least one side of the chuck 102, e.g., at the periphery or edges of the chuck 102. FIG. 4B illustrates another tester 100', which is similar to tester 100 shown in FIG. 4A, except the configuration of the chuck 102' and the location of the positioning system 106' are different in FIG. 4B. As can be seen in FIG. 4B, the chuck 102' includes a concave portion 103' in which the bottom electromagnets are located.

Figure 6:
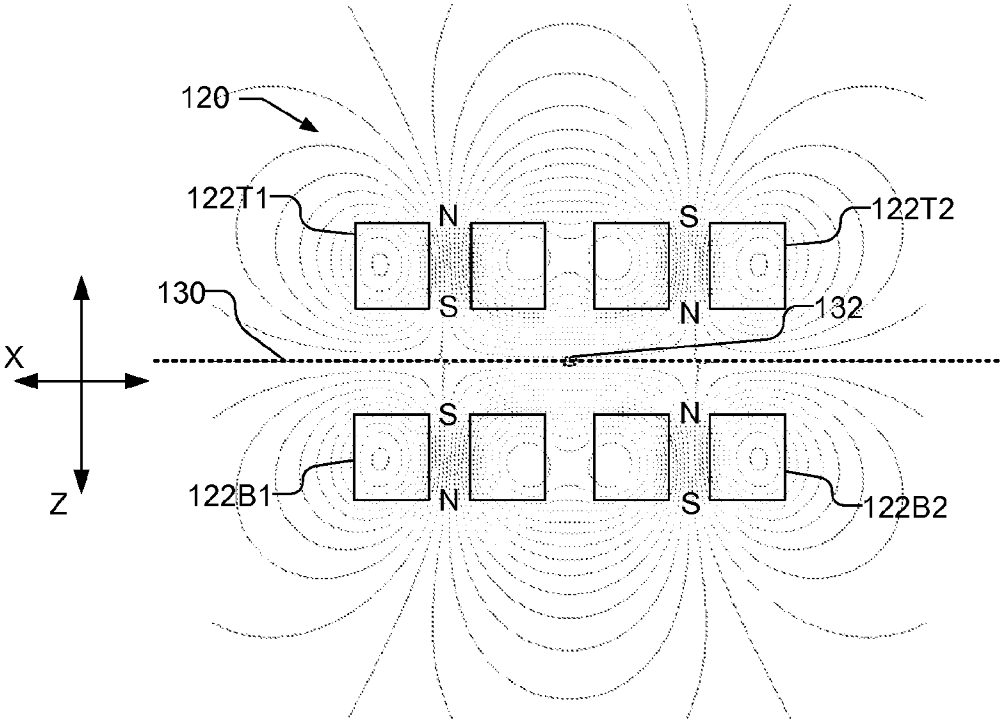
FIG. 6 is a cross-sectional side view of the arrangement of electromagnets and the magnetic field lines that are produced.

FIG. 6 is a modeled cross-sectional view of the arrangement of electromagnets 120 and the magnetic field lines that are produced. FIG. 6 shows four air core electromagnets 122T1, 122T2, 122B1, 122B2, with the magnetic poles oriented approximately perpendicular to a plane of symmetry 130, which during use approximately coincides with the surface of the article. Electromagnets 122T1 and 122T2 are positioned above and electromagnets 122B1 and 122B2 are positioned below the article. The set of electromagnets 122T1, 122T2, 122B1, and 122B2 define a plane that is approximately perpendicular to the plane of symmetry 130.

The top electromagnets 122T1 and 122T2 have complementary magnetic pole orientations, e.g., with the South and North poles, respectively, nearest the article. Similarly, the bottom electromagnets 122B1 and 122B2 have complementary magnetic pole orientations, e.g., with the South and North poles, respectively, nearest the article. The top electromagnets 122T1 and 122T2 and the bottom electromagnets 122B1 and 122B2, however, are arranged in mirror image with respect to the plane of symmetry 130. In other words, the electromagnets 122T1 and 122B1 are positioned to place the same magnetic poles, i.e., South, opposite each other with respect to the plane of symmetry 130 and the electromagnets 122B2 and 122B2 are also positioned to place the same magnetic poles, i.e., North, opposite each other with respect to the plane of symmetry 130. Consequently, a repulsive magnetic field is produced between the facing pairs of electromagnets. The complementary poles of the top electromagnets 122T1 and 122T2 and the bottom electromagnets 122B1 and 122B2, however, create an attractive magnetic field. Consequently, parallel magnetic field lines are generated along the plane of symmetry 130 in an area 132 that is approximately equidistant from the facing electromagnets, i.e., between electromagnet pairs 122T1/122B1 and 122T2/122B2. Thus, by placing the surface 105 of the wafer 104 (or other article under test or manufacture) so that it approximately coincides with the plane of symmetry 130 and by placing the head (or other article under test or manufacture) within the area 132 that is approximately equidistant between the facing electromagnets, an in-plane magnetic field is generated.

It should be understood that the location of the plane of symmetry and the area 132 may be changed by changing the strength of the magnetic fields in appropriate electromagnets. Consequently, the precise physical location of the electromagnets may be altered while producing the in-plane magnetic field by appropriately varying the magnetic fields produced in the electromagnets. Moreover, it may be possible to arrange the electromagnets so that their magnetic poles are oriented non-perpendicular to a plane of symmetry 130. Moreover, it should be understood that because the electromagnets are controlled by current through windings, any magnetic pole orientation may be switched, i.e., electromagnet 122T1 may be switched to produce a North pole nearest the article. The other electromagnets would need to be appropriately switched.

Figure 7A:
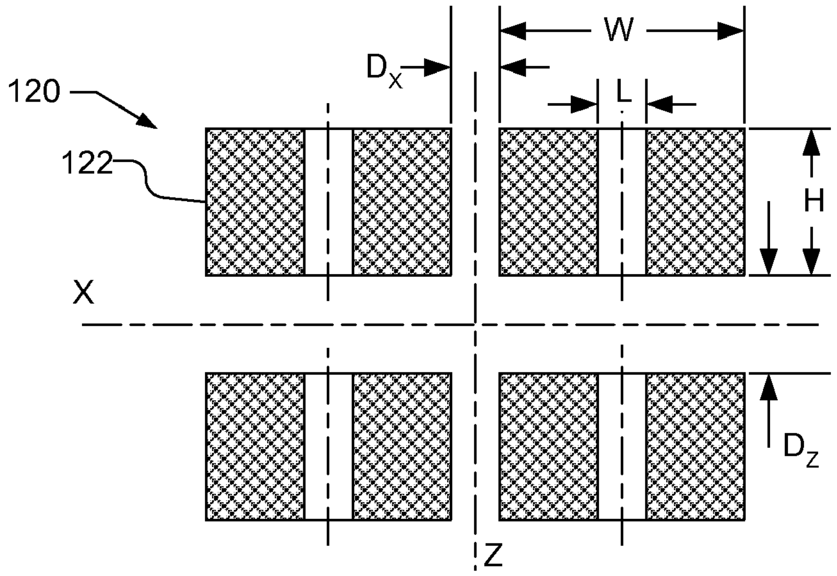
FIGS. 7A, 7B, and 7C are cross-sectional views illustrating possible configurations for the arrangement of the electromagnets.

FIG. 7A is a cross-sectional view illustrating the dimensions of one possible configuration for the arrangement of the electromagnets 120. Each air core electromagnet 122 may be a square with a width W and a height H, which may be, e.g., 2.4 inches and 1.1 inch, respectively. The center air core may have a square configuration with a length L, e.g., of approximately 0.5 inches. The electromagnets may be separated horizontally, i.e., along the X axis, by a distance $D_X$, which may be, e.g., 0.6 inches, and may be separated vertically, i.e., along the Z axis, by a distance $D_Z$, which may be, e.g., 1.3 inches. It should be understood that these distances are exemplary, and that, if desired, other dimensions and distances may be used.

Figure 7B:
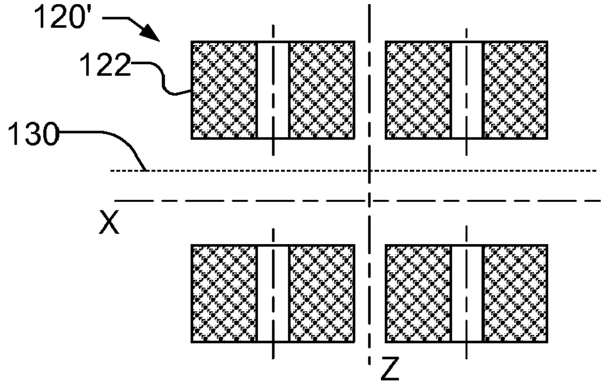
Figure 7C:
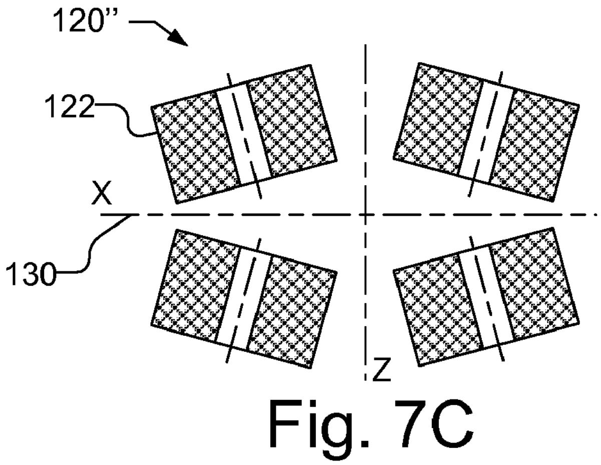

FIGS. 7B and 7C are cross-sectional views illustrating other possible configurations for the arrangement of the electromagnets 120' and 120". As illustrated in FIG. 7B, the location of the plane of symmetry 130 does not necessarily coincide with the X axis for electromagnets 120', e.g., if the strength of the magnetic fields produced by the bottom electromagnets is greater than the top electromagnets. Moreover, as illustrated in FIG. 7C, the arrangement of electromagnets 120" may be such that the magnetic poles are non-perpendicular to the plane of symmetry, which is illustrated as coinciding with the X axis in FIG. 7C.

Figure 8:
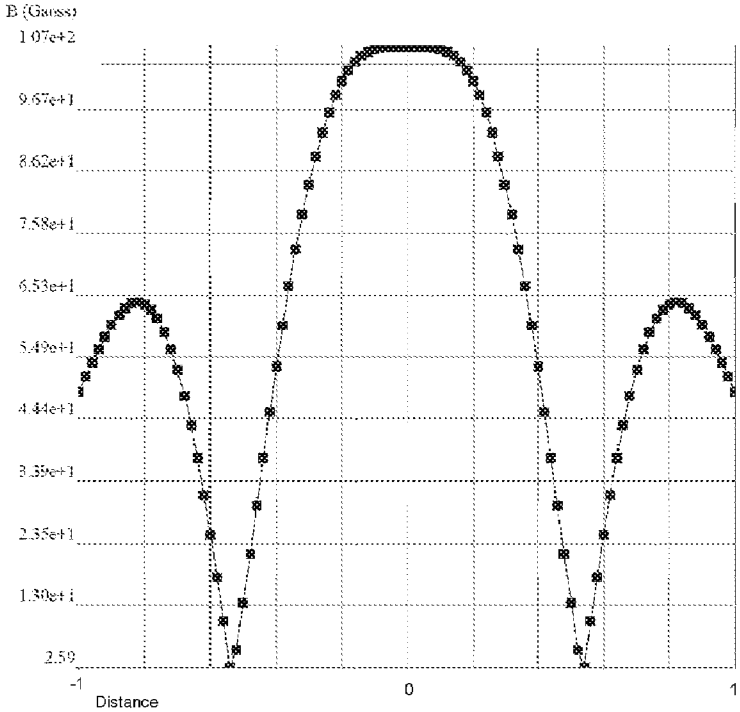
FIG. 8 is a graph illustrating the values of the magnetic field in the horizontal direction along the plane of symmetry, shown in FIGS. 6 and 7.
Figure 9:
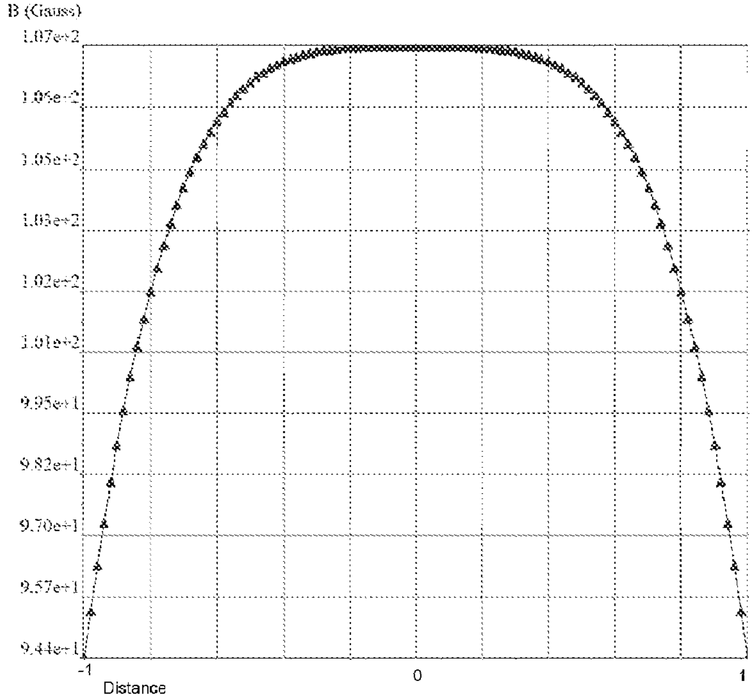
FIG. 9 is a graph illustrating the values of the magnetic field in the vertical direction, shown in FIGS. 6 and 7.

FIG. 8 is a graph illustrating the values of the magnetic field in the horizontal direction along the plane of symmetry 130 (X axis), in normalized units −1 to 1, shown in FIGS. 6 and 7. The graph illustrates the magnetic field (B) along the Y axis and horizontal distance along the X axis. As can be seen, approximately equidistant between the electromagnets, e.g., at approximately 0, on the X axis in FIG. 8, the value of the magnetic field is constant. FIG. 9 is a graph illustrating the values of the magnetic field in the vertical direction (Z axis), shown in FIGS. 6 and 7, where the Y axis of the graph illustrates the magnetic field (B) and the X axis of the graph illustrates the distance, in normalized units −1 to 1, along the Z axis of the arrangement electromagnets 120. As can be seen, the value of the magnetic field is approximately constant around 0, which coincides with the plane of symmetry 130.

Figure 10:
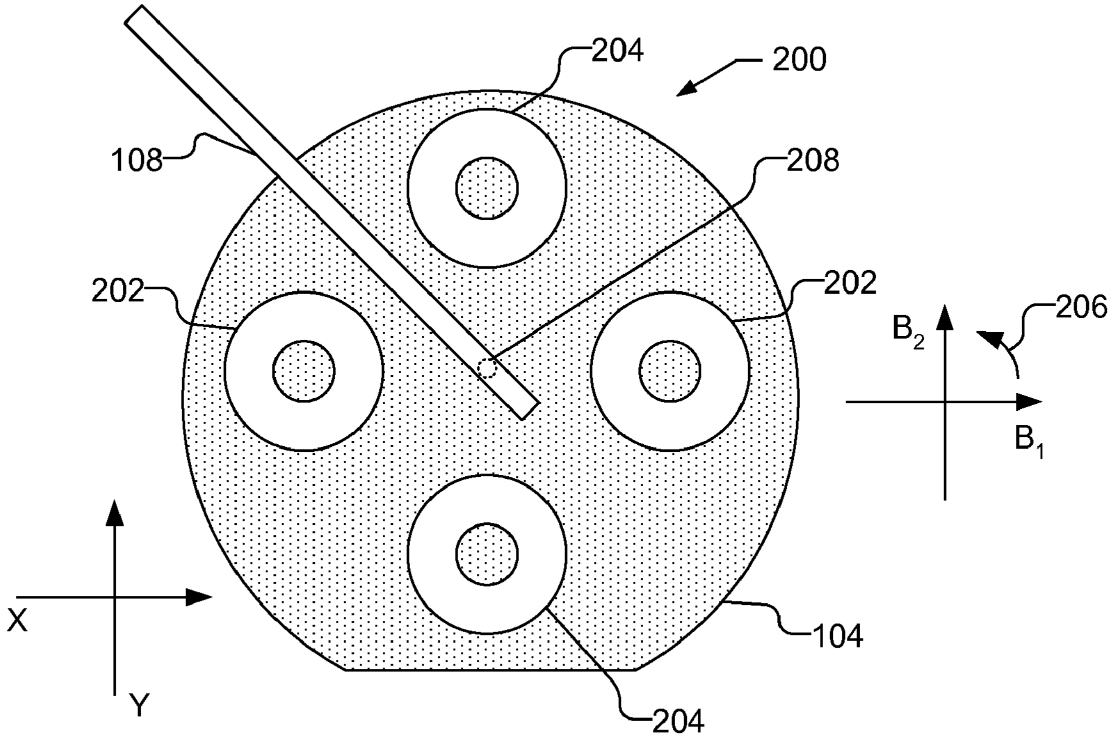
FIG. 10 is a top view of an arrangement of electromagnets, in which two separate sets of electromagnets are used to control the orientation of the magnetic field.

FIG. 10 is a top view of an arrangement of electromagnets 200, in which two separate sets of electromagnets are used to control the orientation of the magnetic field. The arrangement includes a first set of electromagnets 202 and a second set of electromagnets 204. As illustrated in FIGS. 6 and 7, each set 202 and 204 includes corresponding electromagnets below the wafer 104, but which are hidden from view in FIG. 10. By activating the electromagnet set 202 and deactivating the electromagnet set 204, an in-plane magnetic field with an orientation $B_1$ can be generated. Similarly, by activating the electromagnet set 204 and deactivating the electromagnet set 202, an in-plane magnetic field with an orientation $B_2$ can be generated. By simultaneously activating both the electromagnet sets 202 and 204, and by controlling the magnitudes of the magnetic fields generated by each set, the resulting magnetic field can have any orientation between $B_1$ and $B_2$, as illustrated by the arrow 206. The positioning system 106 (shown in FIG. 4A) can be used to move the wafer 104 in the X and Y directions to place any desired location on the wafer 104 in the test position, indicated by circle 208, which is under the contact pins of the probe card 108.

Figure 11A:
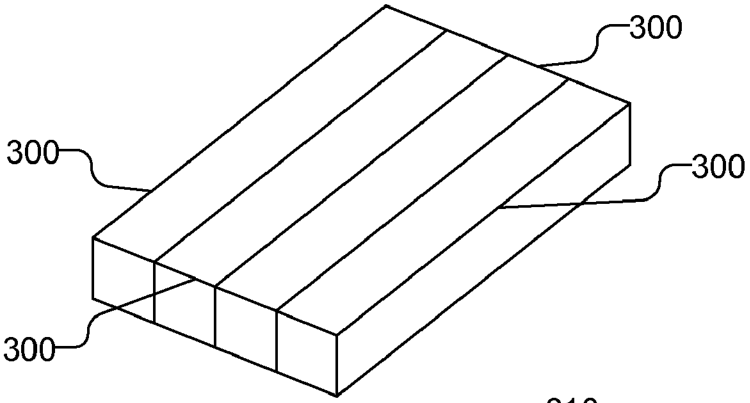
FIGS. 11A and 11B illustrate magnetoresistive heads held in different forms.
Figure 11B:
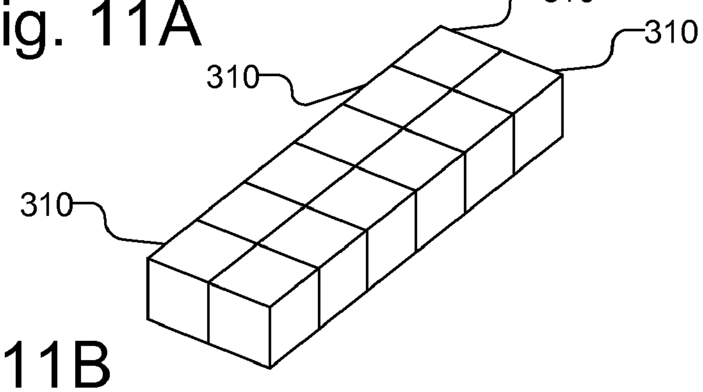

It should be understood that the present invention is not limited to testing MR heads in wafer form, but may test MR heads in other forms, e.g., individually or in bar form. For example, FIG. 11A illustrates a number of bars 300, each of which includes a plurality of sliders. The bars 300 may be grouped together on a chuck, to form a wafer-type array. Alternatively, the chuck may hold a single bar 300. FIG. 11B illustrates a number of individual sliders 310 that are grouped together in a wafer-type array. Alternatively, the chuck may hold a single slider 310 or a group of sliders in a bar-type array. Alternatively, MR heads in the form of one or more head gimbal assemblies and/or stacks, e.g., held on their side, may be tested in accordance with the present invention. In some embodiments, the probe card 108 which includes needles to contact the MR heads, as illustrated in FIG. 4A, may be replaced with another appropriate type of electrical connector, such as pogopins. Additionally, while an MR head tester is described herein, the arrangement of electromagnets may be used for other types of testers or processing equipment in which an in-plane magnetic field is desired.

Figure 12A:
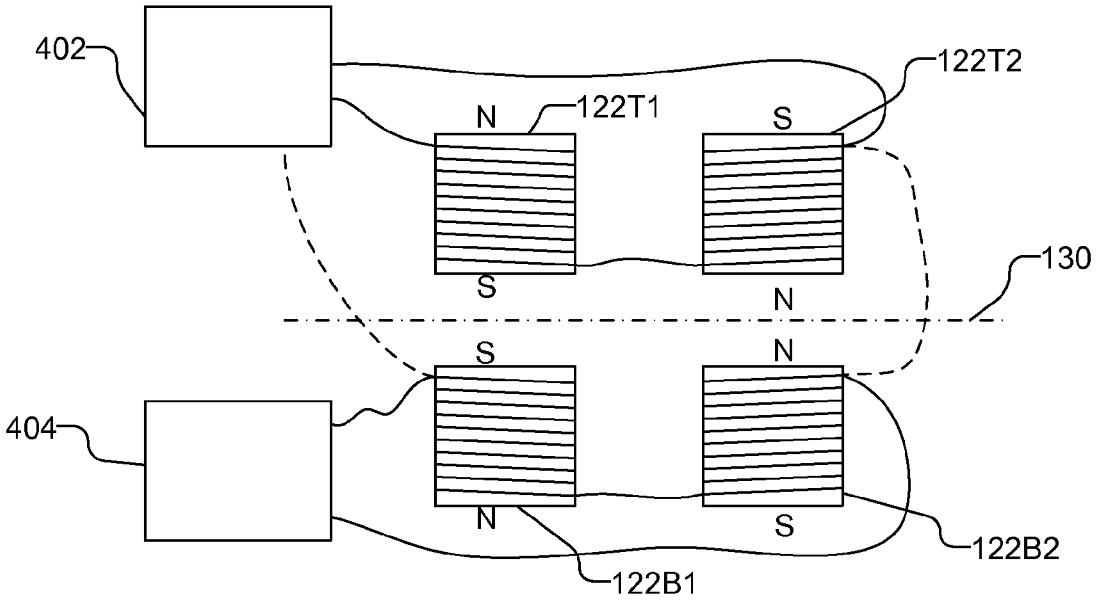
FIGS. 12A, 12B, and 12C illustrate embodiments of producing the magnetic field.

In one embodiment, each electromagnet is independently controlled. In another embodiment, as illustrated in FIG. 12A, the windings of the top electromagnets 122T and 122T2 may be electrically coupled together and serially coupled to the same controller 402 to produce the desired magnetic fields. The controller 402 generates the desired current in the windings of the electromagnets to produce the appropriate magnetic field. Similarly, the windings of the bottom electromagnets 122B1 and 122B2 may be electrically coupled together and serially coupled to a controller 404 to produce the desired magnetic fields from the bottom electromagnets. In another embodiment, the top electromagnets 122T1, 122T2 and bottom electromagnets 122B1, 122B2 are all serially coupled to the same controller 402, as illustrated by the dotted lines in FIG. 12A. In this manner, both the top electromagnets 122T1, 122T2 and bottom electromagnets 122B1, 122B2 will produce the magnetic fields with the same magnitude if they have a symmetrical field geometry, which may include parameters such as size, the turns of the windings, and the proximity to the plane of symmetry or any other parameter or combination of parameters that affect the field.

Figure 12B:
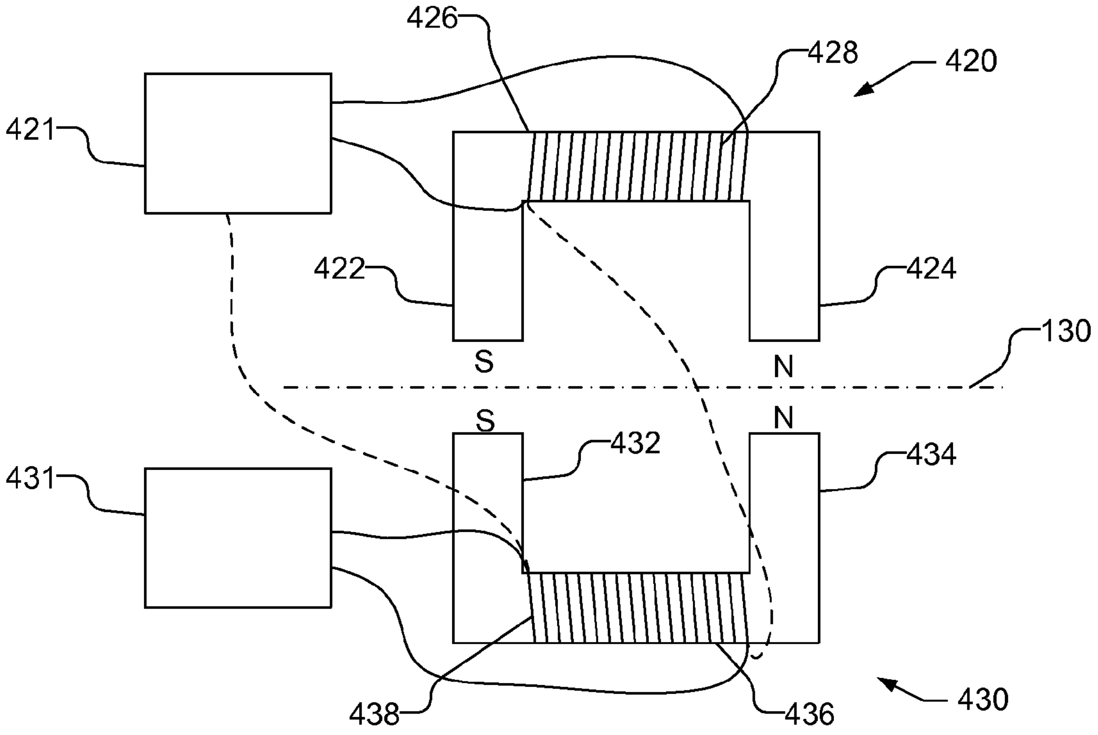

In another embodiment, the electromagnets are physically coupled together by a solid bridge element. FIG. 12B illustrates an embodiment in which the top electromagnet 420 includes two poles, a south pole 422 and a north pole 424, which are coupled together by a bridge 426, in a configuration sometimes referred to as a C-core. FIG. 12B illustrates the windings 428 around the bridge 426, but if desired, the windings may be around poles 422 and 424 and/or the bridge 426. It should be understood that the polarities of the poles 422 and 424 is dependent on the direction of the current through windings 428 and that the use of the labels south and north are used simply for the sake of simplicity. The north/south poles may be reversed by reversing the current in the windings 428.

As illustrated in FIG. 12B, a bottom electromagnet 430 includes two poles, a south pole 432 and a north pole 434, which are coupled together by a bridge 436 with windings 438. The top electromagnet 420 and the bottom electromagnet 430 can be independently controlled by controllers 421 and 431, respectively. Alternatively, the top electromagnet 420 and bottom electromagnet 430 may be serially coupled to a single controller 421, as illustrated by the dotted lines in FIG. 12B.

Figure 12C:
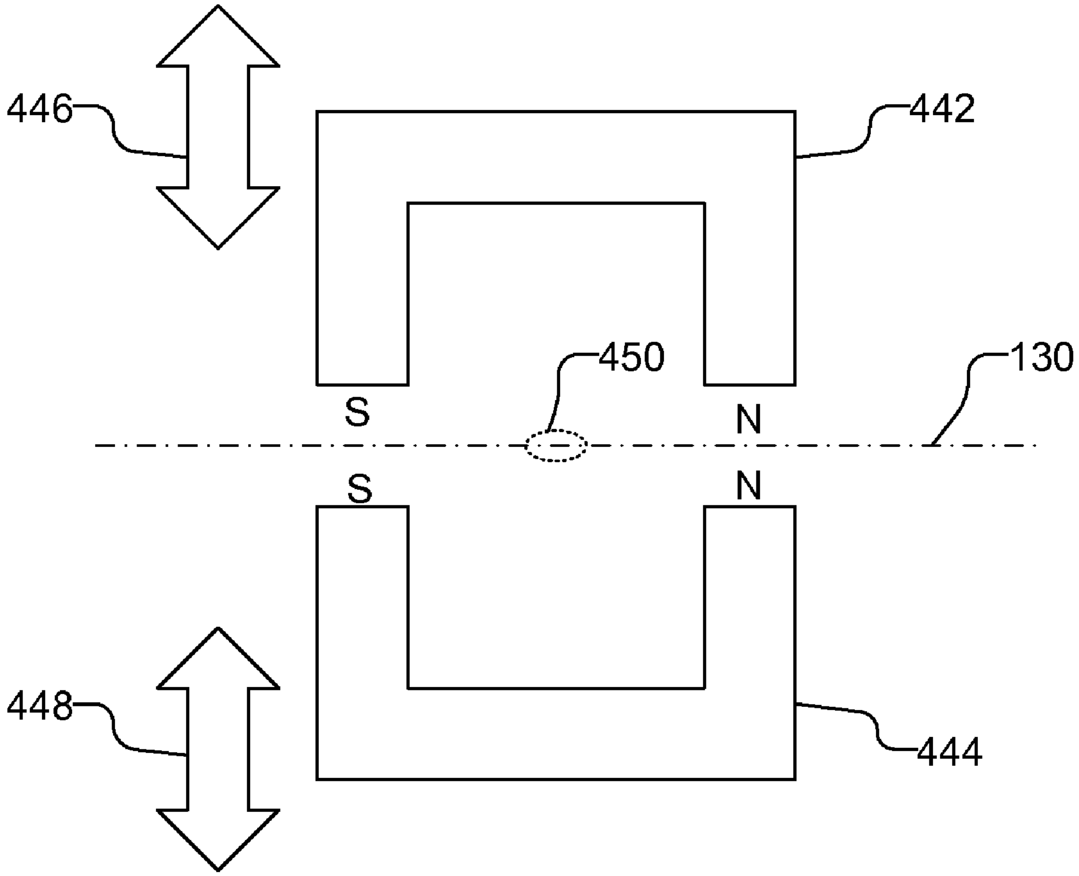

In another embodiment, a permanent magnet may be used, as opposed to electromagnets. The strength of the magnetic field at the location of the article under test may be controlled by physically moving the magnets together or apart. FIG. 12C illustrates an embodiment in which a top magnet 442 having a C-core configuration is mounted above the line of symmetry 130 and a bottom magnet 444, also having a C-core configuration is mounted below the line of symmetry 130. As indicated by arrows 446 and 448, the top and bottom magnets 442 and 444 may be moved toward or away from the line of symmetry 130 to increase or decrease the magnitude of the magnetic field at the position of the article under test, indicated by circle 450. It should be understood that while the magnets are illustrated as having a C-core configuration, other configuration may be possible, including four separate permanent magnets in the same configuration as illustrated, e.g., in FIG. 6.

Although the present invention is illustrated in connection with specific embodiments for instructional purposes, the present invention is not limited thereto. Various adaptations and modifications may be made without departing from the scope of the invention. Therefore, the spirit and scope of the appended claims should not be limited to the foregoing description.

What is claimed is:

1. An apparatus comprising:

a set of magnets for producing an in-plane magnetic field with respect to an article having a top surface and a bottom surface, the set of magnets comprising a first magnetic pole and a second magnetic pole above and generally facing a plane of symmetry and a third magnetic pole and a fourth magnetic pole below and generally facing the plane of symmetry, the first magnetic pole is closer to the third magnetic pole than the fourth magnetic pole and the second magnetic pole is closer to the fourth magnetic pole than the third magnetic pole, the first magnetic pole and the second magnetic pole having opposite magnetic polarities and the third magnetic pole and the fourth magnetic pole having opposite polarities, the first magnetic pole and the third magnetic pole having the same magnetic polarities and the second magnetic pole and fourth magnetic pole have the same magnetic polarities;

wherein the article is one or more magnetoresistive elements, the apparatus further comprising a chuck for holding the one or more magnetoresistive elements, an electrical connector for contacting the one or more magnetoresistive elements under test and a positioning system, the positioning system providing relative movement between the chuck with respect to the set of magnets and the electrical connector to position the one or more magnetoresistive elements under test under the electrical connector.

2. The apparatus of claim 1, wherein the set of magnets is a set of electromagnets comprising at least one top electromagnet above the plane of symmetry and including the first magnetic pole and the second magnetic pole and at least one bottom electromagnet below the plane of symmetry and including the third magnetic pole and the fourth magnetic pole.

3. The apparatus of claim 2, wherein the at least one top electromagnet comprises the first magnetic pole and the second magnetic pole coupled together with a first bridge element and the at least one bottom electromagnetic comprises the third magnetic pole and the fourth magnetic pole coupled together with a second bridge element.

4. The apparatus of claim 2, wherein the at least one top electromagnet and the at least one bottom electromagnetic are serially coupled to a controller.

5. The apparatus of claim 1, wherein the set of magnets is a set of electromagnets comprising a first electromagnet having the first magnetic pole above and generally facing the plane of symmetry, a second electromagnet having the second magnetic pole above and generally facing the plane of symmetry, a third electromagnet having the third magnetic pole below and generally facing the plane of symmetry, and a fourth electromagnet having the fourth magnetic pole below and generally facing the plane of symmetry.

6. The apparatus of claim 5, wherein the first electromagnet and the second electromagnet are serially coupled to a first controller and the third electromagnet and the fourth electromagnet are serially coupled to a second controller.

7. The apparatus of claim 1, wherein the first magnetic pole, the second magnetic pole, the third magnetic pole and the fourth magnetic pole are perpendicular with respect to the plane of symmetry.

8. The apparatus of claim 1, wherein the first magnetic pole, the second magnetic pole, the third magnetic pole and the fourth magnetic pole are non perpendicular with respect to the plane of symmetry.

9. The apparatus of claim 1, wherein the first magnetic pole, the second magnetic pole, the third magnetic pole and the fourth magnetic pole are positioned along a plane that is perpendicular to the plane of symmetry.

10. The apparatus of claim 1, wherein during operation the plane of symmetry and the article are positioned to approximately coincide.

11. The apparatus of claim 10, wherein during operation the plane of symmetry and the top surface of the article are positioned to approximately coincide.

12. The apparatus of claim 1, wherein the set of magnets include at least one of an air core electromagnets and solid core electromagnets.

13. The apparatus of claim 1, wherein the set of magnets is a first set of magnets, the apparatus further comprising a second set of magnets for producing an in-plane magnetic field that is non-parallel with the in-plane magnetic field produced by the first set of magnets, the second set of magnets comprising a fifth magnetic pole and a sixth magnetic pole above and generally facing the plane of symmetry and a seventh magnetic pole and a eighth magnetic pole below and generally facing the plane of symmetry, the fifth magnetic pole is closer to the seventh magnetic pole than the eighth magnetic pole and the sixth magnetic pole is closer to the eighth magnetic pole than the seventh magnetic pole, the fifth magnetic pole and the sixth magnetic pole having opposite magnetic polarities and the seventh magnetic pole and the eighth magnetic pole having opposite magnetic polarities, the fifth magnetic pole and the seventh magnetic pole having the same magnetic polarities and the sixth magnetic pole and eighth magnetic pole have the same magnetic polarities.

14. The apparatus of claim 13, wherein first set of magnets are positioned along a plane that is perpendicular to the plane of symmetry, the second set of magnets are positioned along a plane that is perpendicular to the plane of symmetry and that is perpendicular to the plane defined by the first set of magnets.

15. The apparatus of claim 1, wherein the one or more magnetoresistive elements is one or more magnetoresistive heads.

16. The apparatus of claim 15, wherein the one or more magnetoresistive heads is in wafer form and the electrical connector is a probe card.

17. The apparatus of claim 15, wherein the one or more magnetoresistive heads is one or more bars or sliders or one or more head gimbal assembly or a stack.

18. The apparatus of claim 15, wherein the chuck comprises a top surface for holding the one or more magnetoresistive heads and a bottom surface, the third magnetic pole and fourth magnetic pole being positioned under a bottom surface of the chuck.

19. The apparatus of claim 15, wherein the positioning system is coupled to at least one side of the chuck.

20. The apparatus of claim 1, wherein the one or more magnetoresistive elements are magnetoresistive random access memory (MRAM).

21. An apparatus comprising:

a chuck having a top surface for holding a wafer and a bottom surface; and a set of magnets for producing an in-plane magnetic field with respect to one or more magnetoresistive elements held on the top surface of the chuck, wherein at least one of the chuck and the set of magnets is movable with respect to the other, the set of magnets comprising a first magnetic pole and a second magnetic pole above and generally facing the top surface of the chuck and a third magnetic pole and a fourth magnetic pole below and generally facing the top surface of the chuck, the first magnetic pole is closer to the third magnetic pole than the fourth magnetic pole and the second magnetic pole is closer to the fourth magnetic pole than the third magnetic pole, the first magnetic pole and the second magnetic pole having opposite magnetic polarities and the third magnetic pole and the fourth magnetic pole having opposite polarities, the first magnetic pole and the third magnetic pole having the same magnetic polarities and the second magnetic pole and fourth magnetic pole have the same magnetic polarities; wherein the apparatus is for testing magnetoresistive elements, the apparatus further comprising:

an electrical connector for contacting a magnetoresistive element under test; and a positioning system providing relative movement between the chuck with respect to the set of magnets and the electrical connector to position the one or more magnetoresistive element under test under the electrical connector.

22. The apparatus of claim 21, wherein the set of magnets is a set of electromagnets comprising at least one top electromagnet above the top surface of the chuck and including the first magnetic pole and the second magnetic pole and at least one bottom electromagnet below the top surface of the chuck and including the third magnetic pole and the fourth magnetic pole.

23. The apparatus of claim 21, wherein the set of magnets is a set of electromagnets comprising a first electromagnet having the first magnetic pole above and generally facing the top surface of the chuck, a second electromagnet having the second magnetic pole above and generally facing the top surface of the chuck, a third electromagnet having the third magnetic pole below and generally facing the top surface of the chuck, and a fourth electromagnet having the fourth magnetic pole below and generally facing the top surface of the chuck.

24. The apparatus of claim 21, wherein the magnetoresistive element is magnetoresistive random access memory (MRAM).

25. The apparatus of claim 21, wherein the apparatus is for testing magnetoresistive heads.

26. The apparatus of claim 25, wherein the electrical connector is a probe card.

27. The apparatus of claim 25, wherein the one or more magnetoresistive elements is in wafer form.

28. The apparatus of claim 25, wherein the one or more magnetoresistive elements is one or more bars or sliders or one or more head gimbal assembly or a stack.

29. The apparatus of claim 21, wherein the first magnetic pole, the second magnetic pole, the third magnetic pole and the fourth magnetic pole are perpendicular with respect to the top surface of the chuck.

30. The apparatus of claim 21, wherein the first magnetic pole, the second magnetic pole, the third magnetic pole and the fourth magnetic pole are non perpendicular with respect to the top surface of the chuck.

31. The apparatus of claim 21, wherein the first magnetic pole, the second magnetic pole, the third magnetic pole and the fourth magnetic pole are positioned along a plane that is perpendicular to the top surface of the chuck.

32. The apparatus of claim 21, wherein the set of magnets include at least one of an air core electromagnets and solid core electromagnets.

33. An apparatus comprising:

a chuck having a top surface for holding a wafer and a bottom surface; and a set of magnets for producing an in-plane magnetic field with respect to one or more magnetoresistive elements held on the top surface of the chuck, wherein at least one of the chuck and the set of magnets is movable with respect to the other, the set of magnets comprising a first magnetic pole and a second magnetic pole above and generally facing the top surface of the chuck and a third magnetic pole and a fourth magnetic pole below and generally facing the top surface of the chuck, the first magnetic pole is closer to the third magnetic pole than the fourth magnetic pole and the second magnetic pole is closer to the fourth magnetic pole than the third magnetic pole, the first magnetic pole and the second magnetic pole having opposite magnetic polarities and the third magnetic pole and the fourth magnetic pole having opposite polarities, the first magnetic pole and the third magnetic pole having the same magnetic polarities and the second magnetic pole and fourth magnetic pole have the same magnetic polarities;

wherein the set of magnets is a first set of magnets, the apparatus further comprising a second set of magnets for producing an in-plane magnetic field that is non-parallel with the in-plane magnetic field produced by the first set of magnets, the second set of magnets comprising a fifth magnetic pole and a sixth magnetic pole above and generally facing the top surface of the chuck and a seventh magnetic pole and a eighth magnetic pole below and generally facing the top surface of the chuck, the fifth magnetic pole is closer to the seventh magnetic pole than the eighth magnetic pole and the sixth magnetic pole is closer to the eighth magnetic pole than the seventh magnetic pole, the fifth magnetic pole and the sixth magnetic pole having opposite magnetic polarities and the seventh magnetic pole and the eighth magnetic pole having opposite magnetic polarities, the fifth magnetic pole and the seventh magnetic pole having the same magnetic polarities and the sixth magnetic pole and eighth magnetic pole have the same magnetic polarities.

34. The apparatus of claim 33, wherein first set of magnets are positioned along a plane that is perpendicular to the top surface of the chuck, the second set of magnets are positioned along a plane that is perpendicular to the top surface of the chuck and that is perpendicular to the plane defined by the first set of magnets.

35. The apparatus of claim 33, wherein the first set of magnets and the second set of magnets are electromagnets and the orientation of a magnetic field produced by first set of electromagnets and the second set of electromagnets can be rotated by adjusting currents applied to windings of the electromagnets.

36. A method comprising:

holding a magnetoresistive element under test on a chuck;

positioning the magnetoresistive element under test with respect to a set of magnets and an electrical connector to place the magnetoresistive element under test in contact with the electrical connector;

applying a first magnetic field having a first magnetic polarity above the surface of the magnetoresistive element under test and that is laterally displaced in a first direction with respect to the magnetoresistive element under test;

applying a second magnetic field having a second magnetic polarity below the surface of the magnetoresistive element under test and that is laterally displaced in the first direction with respect to the magnetoresistive element under test, the second magnetic polarity is opposite the first magnetic polarity;

applying a third magnetic field having the second magnetic polarity above the surface of the magnetoresistive element under test and that is laterally displaced in a second direction with respect to the magnetoresistive element under test;

applying a fourth magnetic field having the first magnetic polarity below the surface of the magnetoresistive element under test and that is laterally displaced in the second direction with respect to the magnetoresistive element under test;

wherein the combined first magnetic field, second magnetic field, third magnetic field, and fourth magnetic field produce at the magnetoresistive element under test an in-plane magnetic field with respect to the magnetoresistive element under test;

testing the magnetoresistive element under test while the in-plane magnetic field with respect to the magnetoresistive element under test is produced; and reporting the results of the testing of the magnetoresistive element.

37. The method of claim 36, wherein the first magnetic field and third magnetic field are applied with a first electromagnet and the second magnetic field and fourth magnetic field are applied with a second electromagnet.

38. The method of claim 36, wherein the first magnetic field, second magnetic field, third magnetic field and fourth magnetic field are applied with individual electromagnets.

39. The method of claim 38, wherein two or more of the individual electromagnets are electrically coupled together serially and controlled by the same controller.

40. The method of claim 36, applying a fifth magnetic field having the first magnetic polarity above the surface of an magnetoresistive element under test and that is laterally displaced in a third direction with respect to the magnetoresistive element under test;

applying a sixth magnetic field having the second magnetic polarity below the surface of the magnetoresistive element under test and that is laterally displaced in the third direction with respect to the magnetoresistive element under test;

applying a seventh magnetic field having the second magnetic polarity above the surface of the magnetoresistive element under test and that is laterally displaced in a fourth direction with respect to the magnetoresistive element under test, the fourth direction is opposite the third direction; and applying an eighth magnetic field having the first magnetic polarity below the surface of the magnetoresistive element under test and that is laterally displaced in the fourth direction with respect to the magnetoresistive element under test;

wherein the combined first magnetic field, second magnetic field, third magnetic field, fourth magnetic field, fifth magnetic field, sixth magnetic field, seventh magnetic field, and eighth magnetic field produce at the magnetoresistive element under test an in-plane magnetic field with respect to the surface of the magnetoresistive element under test having a desired magnetic orientation along the surface of the magnetoresistive element under test.

41. The method of claim 36, wherein the magnetoresistive element is one of a magnetoresistive head and magnetoresistive random access memory (MRAM).

42. An apparatus comprising:

a chuck having a top surface for holding a wafer and a bottom surface; and a set of magnets for producing an in-plane magnetic field with respect to one or more magnetoresistive elements held on the top surface of the chuck, wherein at least one of the chuck and the set of magnets is movable with respect to the other, the set of magnets comprising a first magnetic pole and a second magnetic pole above and generally facing the top surface of the chuck and a third magnetic pole and a fourth magnetic pole below and generally facing the top surface of the chuck, the first magnetic pole is closer to the third magnetic pole than the fourth magnetic pole and the second magnetic pole is closer to the fourth magnetic pole than the third magnetic pole, the first magnetic pole and the second magnetic pole having opposite magnetic polarities and the third magnetic pole and the fourth magnetic pole having opposite polarities, the first magnetic pole and the third magnetic pole having the same magnetic polarities and the second magnetic pole and fourth magnetic pole have the same magnetic polarities;

wherein the bottom surface of the chuck has a concave portion and the third magnetic pole and fourth magnetic pole are positioned at least partially within the concave portion of the bottom surface of the chuck.

* * * * *